United States Patent
Hsieh et al.

(10) Patent No.: US 9,997,548 B1
(45) Date of Patent: Jun. 12, 2018

(54) METHOD OF FABRICATING SEMICONDUCTOR DISPLAY APPARATUS

(71) Applicant: HIMAX TECHNOLOGIES LIMITED, Tainan (TW)

(72) Inventors: Yu-Jui Hsieh, Tainan (TW); Po-Nan Chen, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days. days.

(21) Appl. No.: 15/593,317

(22) Filed: May 11, 2017

(51) Int. Cl.
| H01L 21/00 | (2006.01) |
| H01L 27/12 | (2006.01) |
| G03F 7/16 | (2006.01) |
| G03F 7/038 | (2006.01) |
| G03F 7/039 | (2006.01) |
| G03F 7/20 | (2006.01) |
| G03F 7/09 | (2006.01) |
| G03F 7/26 | (2006.01) |
| G03F 7/00 | (2006.01) |

(52) U.S. Cl.
CPC ........ H01L 27/1288 (2013.01); G03F 7/0007 (2013.01); G03F 7/038 (2013.01); G03F 7/039 (2013.01); G03F 7/094 (2013.01); G03F 7/16 (2013.01); G03F 7/2022 (2013.01); G03F 7/26 (2013.01)

(58) Field of Classification Search
CPC ....... H01L 27/1288; G03F 7/0007; G03F 7/26
See application file for complete search history.

(56) References Cited

U.S. PATENT DOCUMENTS

| 5,364,809 | A  | * | 11/1994 | Kwon | ............... | H01L 27/10817 |
| | | | | | | 257/E21.019 |
| 7,045,258 | B2 | * | 5/2006 | Chen | ..................... | G02B 5/201 |
| | | | | | | 430/396 |
| 7,405,033 | B2 | * | 7/2008 | Yamazaki | ............. | G03F 7/0007 |
| | | | | | | 257/E27.111 |
| 8,013,963 | B2 | * | 9/2011 | Ko | .......................... | G02B 5/22 |
| | | | | | | 349/106 |
| 8,593,538 | B2 | * | 11/2013 | Nagata | ............. | H01L 27/14621 |
| | | | | | | 348/222.1 |
| 9,917,134 | B1 | * | 3/2018 | Hsieh | ................ | H01L 27/14685 |
| 2004/0219708 | A1 | * | 11/2004 | Lee | .................. | H01L 27/14685 |
| | | | | | | 438/57 |
| 2005/0284393 | A1 | * | 12/2005 | Chen | ..................... | G02B 5/201 |
| | | | | | | 119/211 |

(Continued)

Primary Examiner — Laura Menz
(74) Attorney, Agent, or Firm — CKC & Partners Co., Ltd.

(57) ABSTRACT

A method of fabricating an image sensor includes the following steps. A semiconductor substrate is provided. A first photoresist structure is formed on the semiconductor substrate. A second photoresist structure is formed on the semiconductor substrate and covering the first photoresist structure. A third photoresist structure is formed on the semiconductor substrate and covering the first photoresist structure and the second photoresist structure. A first etching back process is performed to remove a first portion of the third photoresist structure above a top surface of the second photoresist structure. A second etching back process is performed to remove a portion of the second photoresist structure above a top surface of the first photoresist structure and to remove a second portion of the third photoresist structure above the top surface of the first photoresist structure.

16 Claims, 7 Drawing Sheets

(56) References Cited

U.S. PATENT DOCUMENTS

| | | | |
|---|---|---|---|
| 2012/0148946 A1* | 6/2012 | Tu | G02B 5/201 |
| | | | 430/7 |
| 2014/0048691 A1* | 2/2014 | Ovsiannikov | G03B 13/02 |
| | | | 250/208.1 |
| 2015/0212357 A1* | 7/2015 | Huang | G02F 1/13439 |
| | | | 445/24 |
| 2017/0072661 A1* | 3/2017 | Pan | B32B 7/12 |
| 2017/0115571 A1* | 4/2017 | Kato | G03F 7/094 |
| 2017/0261854 A1* | 9/2017 | Yamazaki | G03F 7/093 |
| 2018/0076258 A1* | 3/2018 | Hsieh | H01L 27/14685 |

* cited by examiner

METHOD OF FABRICATING SEMICONDUCTOR DISPLAY APPARATUS

BACKGROUND

Field of the Invention

The invention relates to a semiconductor display apparatus, and more particularly to a method of fabricating a semiconductor display apparatus.

Description of Related Art

A semiconductor display apparatus, such as liquid crystal on silicon (LCoS) display apparatus, involves techniques of the typical LCD panel and complementary metal-oxide semiconductor (CMOS) processes, and therefore it can achieve high resolution, high color saturation and accuracy and can be manufactured by semiconductor processes. With at least such advantages, a semiconductor display apparatus are applied in electronic devices such as micro-projectors, monitors or head mounted displays.

For example, one type of the LCoS display apparatus is a color filter LCoS display apparatus, in which a color filter is formed on a silicon substrate. However, because segments of the color filter (e.g. red, green and blue color photoresists) are sequentially formed on the silicon substrate, which usually results in striation defects and nonuniformity issues.

SUMMARY

In the invention, a method of fabricating a semiconductor display apparatus is provided. In the method, photoresist structures with different heights are sequentially, and several etching back processes are used for etching back the stacked photoresist structures, so as to remove striation defects of the photoresist structures and provides high uniformity of the photoresist structures, thus improving image display accuracy and quality.

One aspect of the invention is directed to a method of fabricating a semiconductor display apparatus. The method includes the following steps. A semiconductor substrate is provided. A first photoresist structure is formed on the semiconductor substrate. A second photoresist structure is formed on the semiconductor substrate and covering the first photoresist structure. A third photoresist structure is formed on the semiconductor substrate and covering the first photoresist structure and the second photoresist structure. A first etching back process is performed to remove a first portion of the third photoresist structure above a top surface of the second photoresist structure. A second etching back process is performed to remove a portion of the second photoresist structure above a top surface of the first photoresist structure and to remove a second portion of the third photoresist structure above the top surface of the first photoresist structure.

In accordance with one or more embodiments of the invention, the semiconductor substrate is formed from silicon, germanium, gallium, arsenic, or a combination thereof.

In accordance with one or more embodiments of the invention, the first photoresist structure is patterned having a continuous layout pattern.

In accordance with one or more embodiments of the invention, the first photoresist structure is patterned having a continuous layout pattern of a stairs shape.

In accordance with one or more embodiments of the invention, after the second etching back process, the second photoresist structure has a continuous layout pattern of a stairs shape.

In accordance with one or more embodiments of the invention, after the first etching back process, the third photoresist structure has a continuous layout pattern of a stairs shape.

In accordance with one or more embodiments of the invention, the first photoresist structure is formed having a pillar shape.

In accordance with one or more embodiments of the invention, after the second etching back process, the second photoresist structure has a pillar shape.

In accordance with one or more embodiments of the invention, after the first etching back process, the third photoresist structure has a pillar shape.

In accordance with one or more embodiments of the invention, a first etching rate of the first etching back process is greater than a second etching rate of the second etching back process.

In accordance with one or more embodiments of the invention, the method further includes performing a third etching back process to etch back the first photoresist structure, the second photoresist structure and the third photoresist structure.

In accordance with one or more embodiments of the invention, both of a first etching rate of the first etching back process and a second etching rate of the second etching back process are greater than a third etching rate of the third etching back process.

In accordance with one or more embodiments of the invention, the step of forming the first photoresist structure includes: exposing the first photoresist structure to light passing through a first mask; and performing a first development process on the first photoresist structure.

In accordance with one or more embodiments of the invention, the step of forming the second photoresist structure includes: exposing the second photoresist structure to light passing through a second mask; and performing a second development process on the second photoresist structure.

In accordance with one or more embodiments of the invention, the step of forming the third photoresist structure includes: exposing the third photoresist structure to light passing through a third mask; and performing a third development process on the third photoresist structure.

In accordance with one or more embodiments of the invention, the first photoresist structure is formed being a red color filter, the second photoresist structure is formed being a blue color filter, and the third photoresist structure is formed being a green color filter.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings.

DETAILED DESCRIPTION

The detailed explanation of the invention is described as following. The described preferred embodiments are presented for purposes of illustrations and description, and they are not intended to limit the scope of the invention.

It will be understood that, although the terms "first," "second," and "third" may be used herein to describe various elements, components, areas, layers and/or regions, these elements, components, areas, layers and/or regions, should not be limited by these terms. These terms are only used to distinguish elements, components, areas, layers and/or regions.

Figure 1:
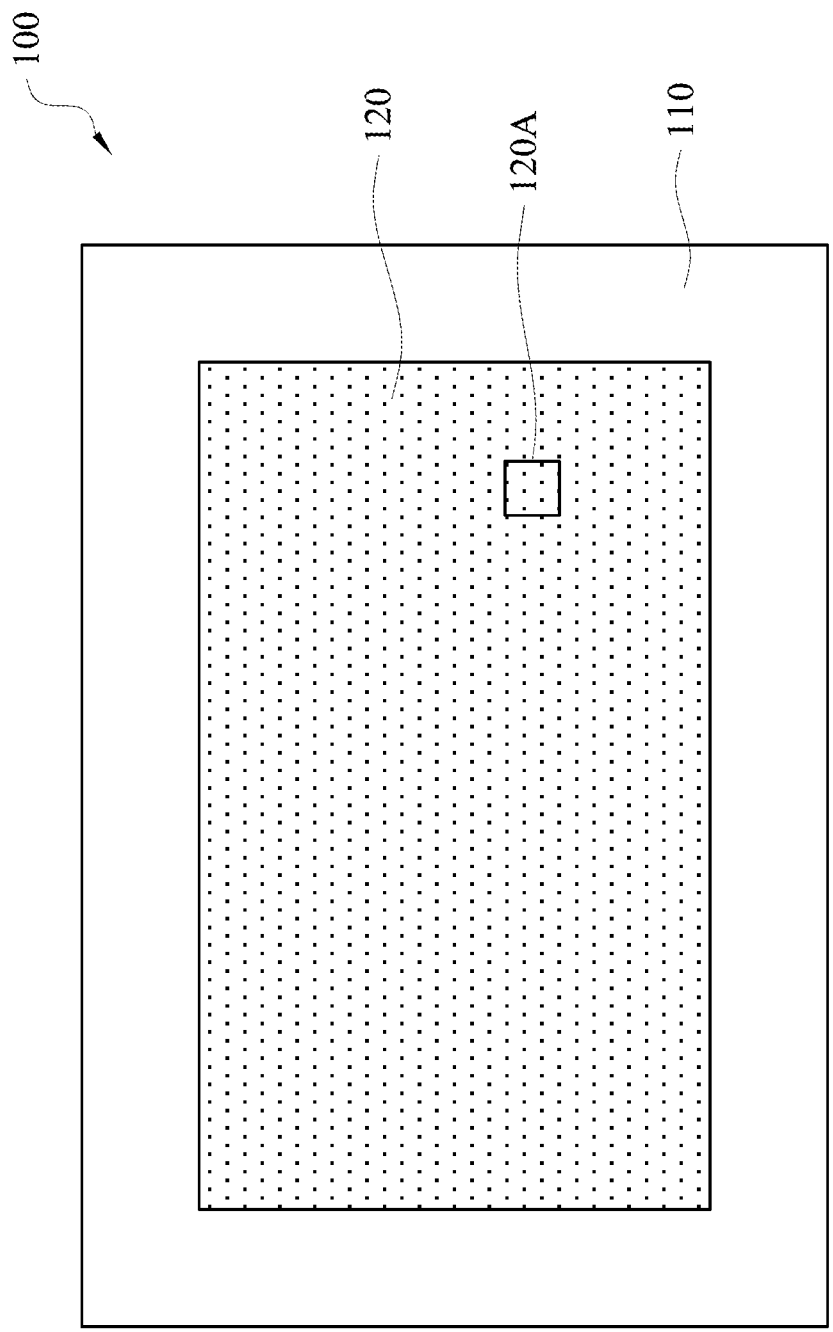
FIG. 1 is a schematic view of a semiconductor display apparatus in accordance with some embodiments of the invention.

FIG. 1 is a schematic view of a semiconductor display apparatus 100 in accordance with some embodiments of the invention. The semiconductor display apparatus 100 may be, for example, a liquid crystal on silicon (LCoS) display apparatus or another similar semiconductor display apparatus that can be practiced by wafer-level manufacturing. The semiconductor display apparatus 100 includes a semiconductor substrate 110 and elements sequentially on the semiconductor substrate 110. For simplicity, these elements are not shown in FIG. 1. The semiconductor substrate 110 may include a semiconductor material, such as silicon, germanium, gallium, arsenic, combinations thereof, and/or another suitable material. The semiconductor substrate 110 has an active area 120 for displaying (or projecting) an image. In certain embodiments, the semiconductor display apparatus 100 may further include a light source module (not shown) for providing illumination light.

Figure 2:
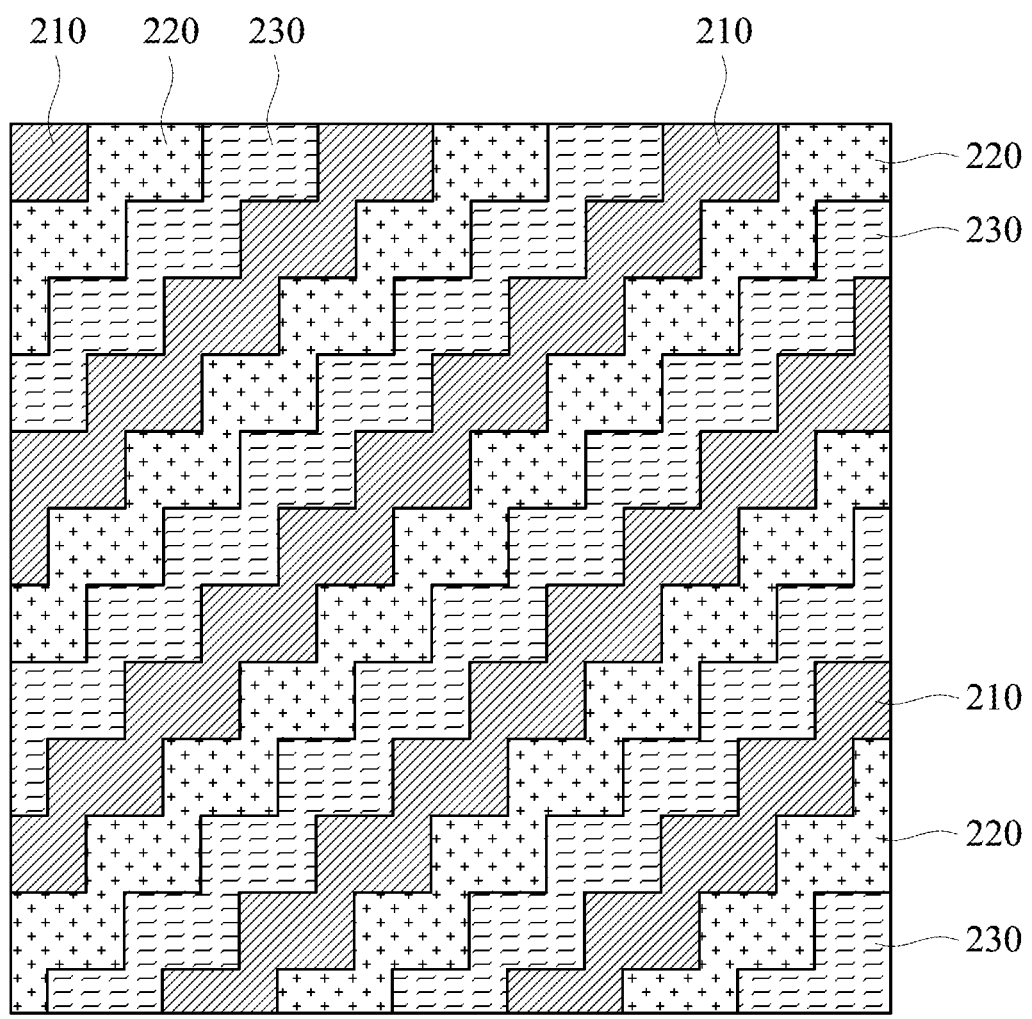
FIG. 2 is an enlarged planar view of a portion of the active area of FIG. 1 in accordance with some embodiments of the invention.

FIG. 2 is an enlarged planar view of a portion 120A of the active area 120 of the semiconductor display apparatus 100 in accordance with some embodiments of the invention. For conveniently describing the invention, FIG. 2 only illustrates first photoresist structures 210, second photoresist structures 220 and third photoresist structures 230. Though not shown in FIG. 2, the active area 120 may also include elements known in the art (e.g., a liquid crystal layer, pixel electrodes, a cover plate, and the like). As shown in FIG. 2, the first to three photoresist structures 210-230 are arranged in a staggered manner, and each of the first to three photoresist structures 210-230 has a stairs shape. Particularly, each of the first to three photoresist structures 210-230 slopes upward from left to right. In alternative embodiments, each of the first to three photoresist structures 210-230 slopes downward from left to right.

The first to three photoresist structures 210-230 may be different color filters for filtering out various wavelength components of light. For example, the first photoresist structures 210 may be green color filters, the second photoresist structures 220 may be red color filters, and the third photoresist structures 230 may be blue color filters. The passing wavelength ranges of the first to three photoresist structures 210-230 may be determined depending on various applications.

Figure 3A:
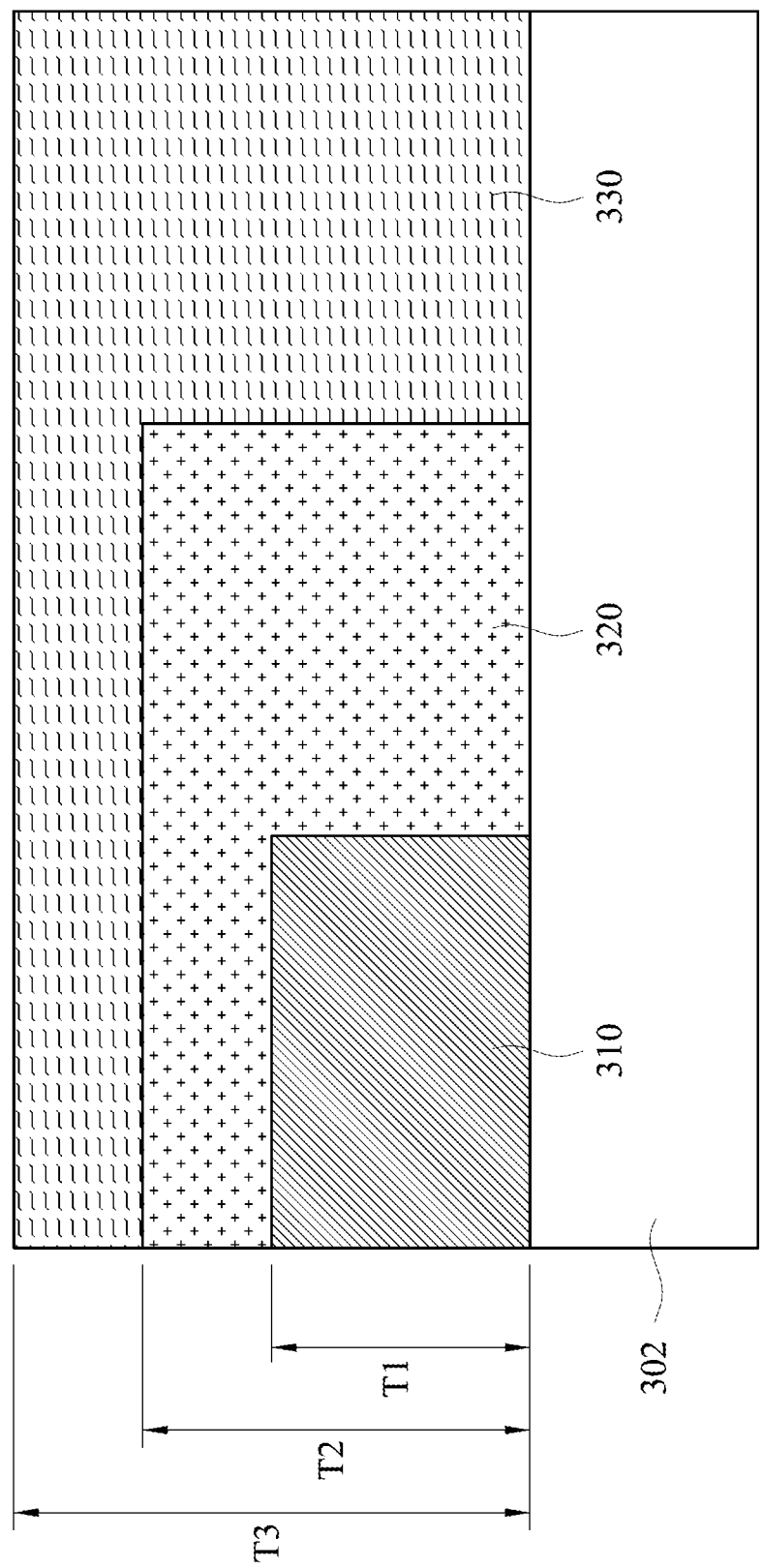
FIG. 3A to FIG. 3D are schematic cross sectional views of intermediate stages in the fabrication of a semiconductor display apparatus in accordance with some embodiments of the invention.

FIG. 3A to FIG. 3D are schematic cross-sectional views of intermediate stages in the fabrication of a semiconductor display apparatus in accordance with some embodiments of the invention. Referring to FIG. 3A, a semiconductor substrate 302 is provided, and a first photoresist structure 310 is formed on the semiconductor substrate 302. The semiconductor substrate 302 is formed from a semiconductor material, such as silicon, germanium, gallium, arsenic, combinations thereof, and/or another suitable material. The first photoresist structure 310 may be formed from dyed or pigmented organic polymer with a desired color by utilizing a coating process and/or another suitable process known in the art. For example, in some embodiments, an exposure process is performed to expose the first photoresist structure 310 to light passing through a mask, and a development process is then performed on the first photoresist structure 310. The first photoresist structure 310 is patterned having a continuous layout pattern of a stairs shape (e.g. similar to the first photoresist structures 210 of FIG. 2) and has a height T1.

Next, a second photoresist structure 320 is formed on the semiconductor substrate 302 and covering the first photoresist structure 310. The second photoresist structure 320 may be formed from dyed or pigmented organic polymer with another desired color by utilizing a coating process and/or another suitable process known in the art. For example, in some embodiments, an exposure process is performed to expose the second photoresist structure 320 to light passing through a mask, and a development process is then performed on the second photoresist structure 320. The second photoresist structure 320 has a height T2 which is greater than the height T1 of the first photoresist structure 310.

Then, a third photoresist structure 330 is formed on the semiconductor substrate 302 and covering the first photoresist structure 310 and the second photoresist structure 320. The third photoresist structure 330 may be formed from dyed or pigmented organic polymer with yet another desired color by utilizing a coating process and/or another suitable process known in the art. The third photoresist structure 330 has a height T3 which is greater than any of the height T1 of the first photoresist structure 310 and the height T2 of the second photoresist structure 320. In some embodiments, the third photoresist structure 330 is patterned having a continuous layout pattern of a stairs shape. Particularly, an exposure process may be performed to expose the third photoresist structure 330 to light passing through a mask, and then a development process may be performed on the third photoresist structure 330.

Figure 3B:
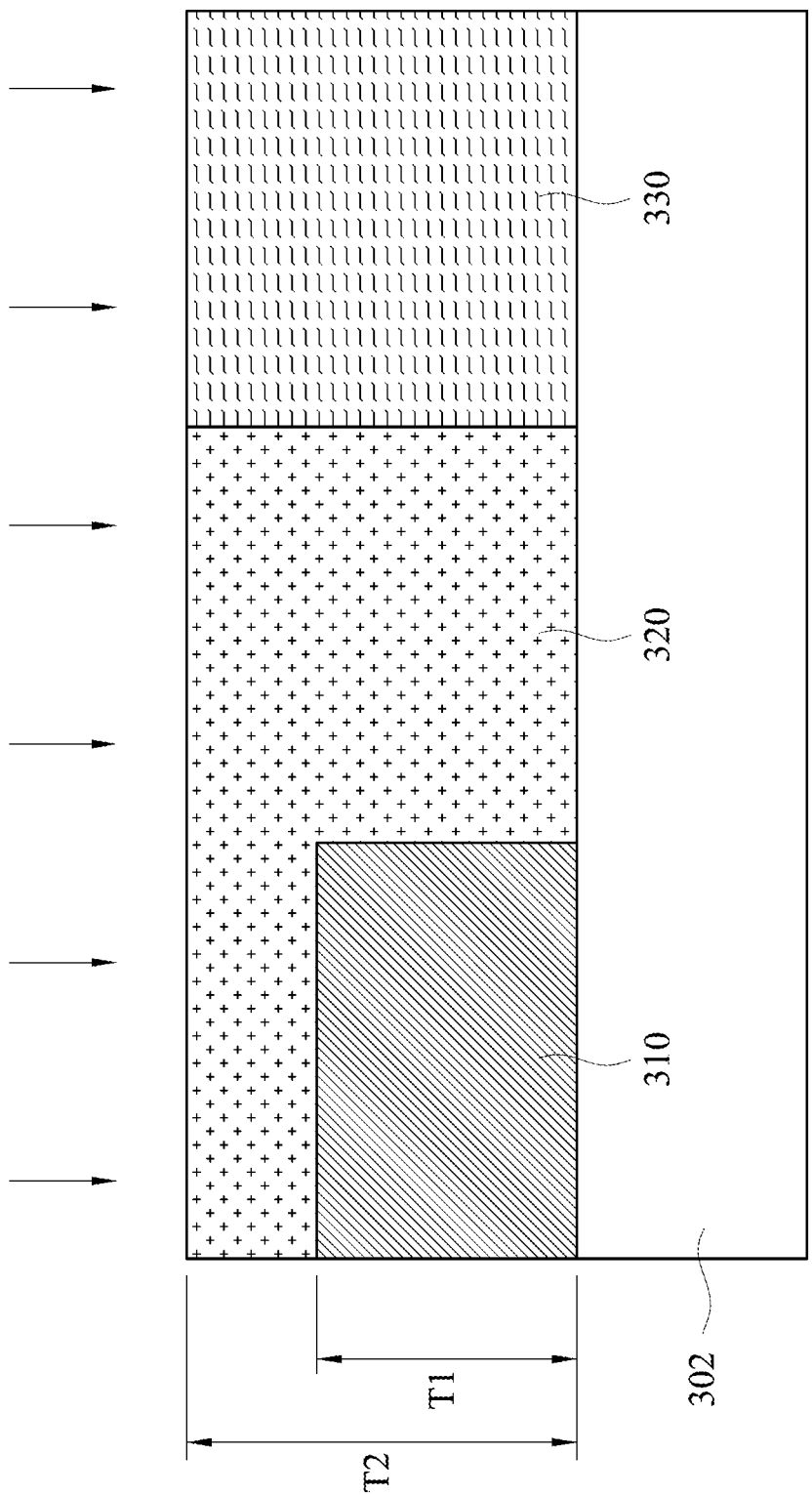

After the forming processes of the first photoresist structure 310, the second photoresist structure 320 and the third photoresist structure 330, several etching back processes are then performed to thinner the stacked photoresist structure shown in FIG. 3A. Referring to FIG. 3B, a first etching back process is performed to remove a portion of the third photoresist structure 330 higher than the second photoresist structure 320. That is, the second photoresist structure 320 is used as an etching stop layer for the first etching back process; the first etching back process stops when the second photoresist structure 320 is exposed. The first etching back process is performed with an etching rate ER1 by using a first enchant which is suitable for etching the third photoresist structure 330. After the first etching back process, the third photoresist structure 330 has a continuous layout pattern of a stairs shape (e.g. similar to the third photoresist structures 230 of FIG. 2).

Figure 3C:
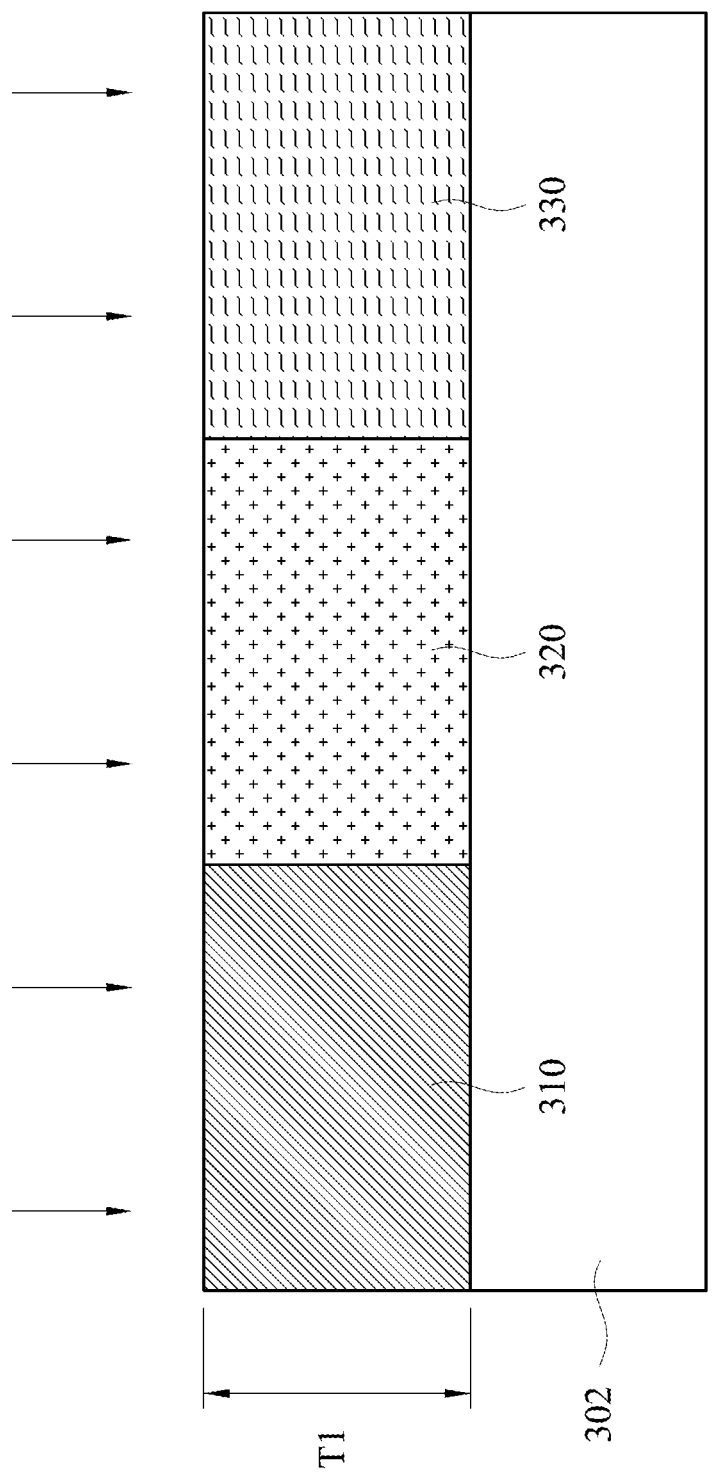

Next, referring to FIG. 3C, a second etching back process is performed to remove a portion of the second photoresist structure 320 higher than the first photoresist structure 310 and another portion of the third photoresist structure 330 higher than the first photoresist structure 310. That is, the first photoresist structure 310 is used as an etching stop layer for the second etching back process; the second etching back process stops when the first photoresist structure 310 is exposed. The second etching back process is performed with an etching rate ER2 by using a second enchant which is suitable for etching the second photoresist structure 320 and the third photoresist structure 330. After the second etching back process, the second photoresist structure 320 has a continuous layout pattern of a stairs shape (e.g. similar to the second photoresist structures 220 of FIG. 2).

Figure 3D:
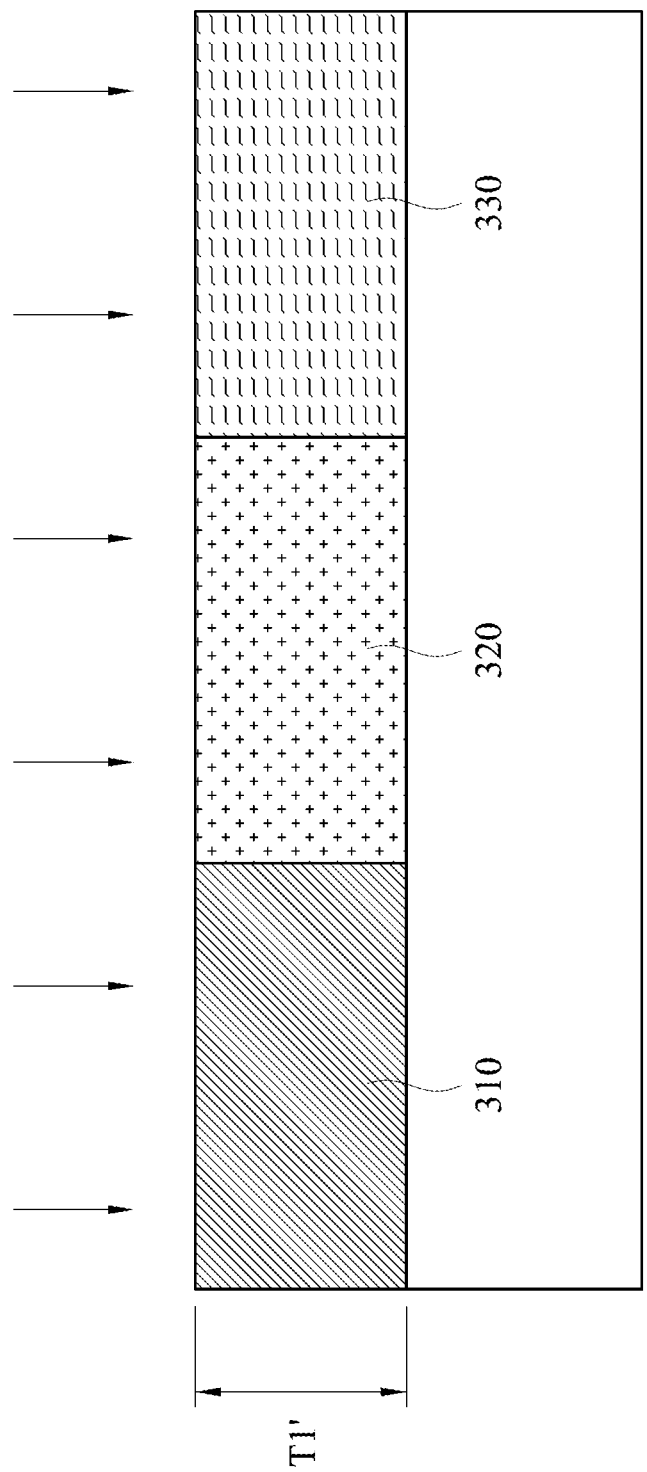

Then, referring to FIG. 3D, a second etching back process is performed to thinner (i.e. etch back) the first photoresist structure 310, the second photoresist structure 320 and the third photoresist structure 330 to a desired height T1' which is less than the height T1. The third etching back process is performed with an etching rate ER3 by using a third enchant which is suitable for etching the first photoresist structure 310, the second photoresist structure 320 and the third photoresist structure 330.

In some embodiments, for the first photoresist structure 310, the second photoresist structure 320 and the third photoresist structure 330 respectively being a green color filter layer, a red color filter layer and a blue color filter layer, the etching rate E2 of the second etching back process is greater than the etching rate E3 of the third etching back process and less than the etching rate E1 of the first etching back process.

Figure 4:
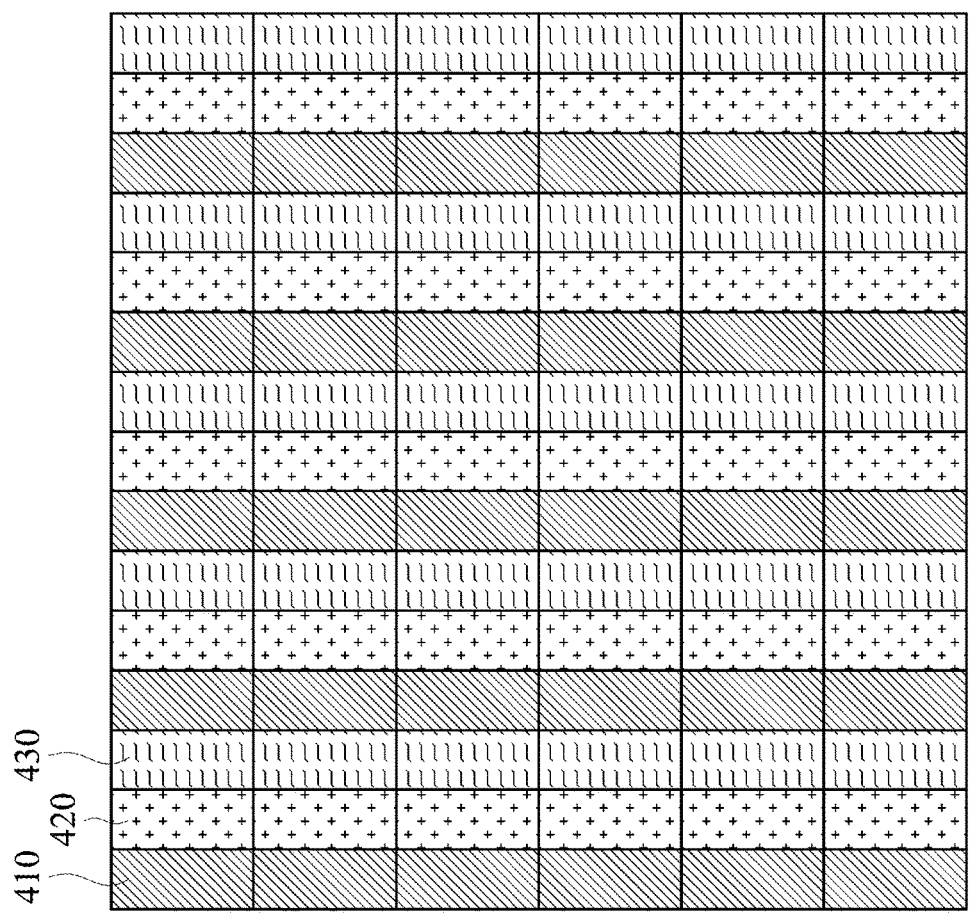
FIG. 4 is an enlarged planar view of a portion of the active area of FIG. 1 in accordance with some embodiments of the invention.

From the above description, the process stages shown in FIG. 3A through FIG. 3D may be applied in fabricating a color filter with continuous stairs shape layout patterns of photoresist structures (such as the first to three photoresist structures 210-230 of FIG. 2), but the invention is not limited thereto. Rather, the invention may further be applied in fabricating a color filter with various types of continuous layout patterns or non-continuous layout patterns of photoresist structures. For example, as shown in FIG. 4, FIG. 4 is an enlarged planar view of a portion 120A of the active area 120 of the semiconductor display apparatus 100 in accordance with some embodiments of the invention. In FIG. 4, first photoresist structures 410, second photoresist structures 420 and third photoresist structures 430 are arranged with pillar shapes. The first to three photoresist structures 410-430 may be formed by processes similar to those for forming the first to three photoresist structures 310-330 shown in FIG. 3A through FIG. 3D.

In the fabricating method of a semiconductor display apparatus in accordance with the embodiments of the invention, a first photoresist structure is formed, and next a second photoresist structures is formed covering the first photoresist structure, and then third photoresist structure is formed covering the second photoresist structure; several etching back processes are used for etching back the stacked photoresist structures, such that striation defects of the first to three photoresist structures are removed and a desired height of the first to three photoresist structures is achieved.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims.

What is claimed is:

1. A method of fabricating a semiconductor display apparatus, the method comprising:
    providing a semiconductor substrate;
    forming a first photoresist structure on the semiconductor substrate;
    forming a second photoresist structure on the semiconductor substrate and covering the first photoresist structure;
    forming a third photoresist structure on the semiconductor substrate and covering the first photoresist structure and the second photoresist structure;
    performing a first etching back process to remove a first portion of the third photoresist structure above a top surface of the second photoresist structure; and
    performing a second etching back process to remove a portion of the second photoresist structure above a top surface of the first photoresist structure and to remove a second portion of the third photoresist structure above the top surface of the first photoresist structure.

2. The method of claim 1, wherein the semiconductor substrate is formed from silicon, germanium, gallium, arsenic, or a combination thereof.

3. The method of claim 1, wherein the first photoresist structure is patterned having a continuous layout pattern.

4. The method of claim 1, wherein the first photoresist structure is patterned having a continuous layout pattern of a stairs shape.

5. The method of claim 4, wherein after the second etching back process, the second photoresist structure has a continuous layout pattern of a stairs shape.

6. The method of claim 5, wherein after the first etching back process, the third photoresist structure has a continuous layout pattern of a stairs shape.

7. The method of claim 1, wherein the first photoresist structure is formed having a pillar shape.

8. The method of claim 7, wherein after the second etching back process, the second photoresist structure has a pillar shape.

9. The method of claim 8, wherein after the first etching back process, the third photoresist structure has a pillar shape.

10. The method of claim 1, wherein a first etching rate of the first etching back process is greater than a second etching rate of the second etching back process.

11. The method of claim 1, further comprising:
    performing a third etching back process to etch back the first photoresist structure, the second photoresist structure and the third photoresist structure.

12. The method of claim 11, wherein both of a first etching rate of the first etching back process and a second etching rate of the second etching back process are greater than a third etching rate of the third etching back process.

13. The method of claim 1, wherein forming the first photoresist structure comprising:
    exposing the first photoresist structure to light passing through a first mask; and
    performing a first development process on the first photoresist structure.

14. The method of claim 1, wherein forming the second photoresist structure comprising:
    exposing the second photoresist structure to light passing through a second mask; and
    performing a second development process on the second photoresist structure.

15. The method of claim 1, wherein forming the third photoresist structure comprising:
    exposing the third photoresist structure to light passing through a third mask; and
    performing a third development process on the third photoresist structure.

16. The method of claim 1, wherein the first photoresist structure is formed being a green color filter, wherein the second photoresist structure is formed being a red color filter, and wherein the third photoresist structure is formed being a blue color filter.

* * * * *